(12) United States Patent
Fujii et al.

(10) Patent No.: US 7,605,442 B2
(45) Date of Patent: Oct. 20, 2009

(54) SEMICONDUCTOR DEVICE

(75) Inventors: Osamu Fujii, Yokohama (JP); Tomoya Sanuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/263,830

(22) Filed: Nov. 3, 2008

(65) Prior Publication Data
US 2009/0057777 A1 Mar. 5, 2009

Related U.S. Application Data

(62) Division of application No. 11/260,480, filed on Oct. 28, 2005, now abandoned.

(30) Foreign Application Priority Data
Oct. 29, 2004 (JP) ............................. 2004-316419

(51) Int. Cl.
*H01L 21/762* (2006.01)
(52) U.S. Cl. ................ 257/510; 257/E21.546
(58) Field of Classification Search ................ 257/308, 257/369, 59, 510–513, E21.546
See application file for complete search history.

(56) References Cited

U.S. PATENT DOCUMENTS

| 6,388,304 | B2  |   | 5/2002  | Matsuoka et al. |         |
|-----------|-----|---|---------|-----------------|---------|
| 6,441,444 | B1  | * | 8/2002  | Tsuji et al.    | 257/374 |
| 6,541,350 | B2  |   | 4/2003  | Chen            |         |
| 2003/0173641 | A1 |  | 9/2003 | Ohta et al.     |         |
| 2004/0032006 | A1 | * | 2/2004 | Yun et al.      | 257/510 |
| 2005/0032275 | A1 |  | 2/2005 | Toda et al.     |         |
| 2005/0167778 | A1 | * | 8/2005 | Kim et al.      | 257/510 |
| 2006/0001104 | A1 | * | 1/2006 | Ookura          | 257/368 |
| 2006/0255426 | A1 | * | 11/2006 | Inoue et al.   | 257/510 |

FOREIGN PATENT DOCUMENTS

JP 2003-179157 A 6/2003
JP 2003-272306 A 9/2003

OTHER PUBLICATIONS

A. Shimizu et al., "Local Mechanical-Stress Control (LMC): A New Technique for CMOS-Performance Enhancement", International Electron Devices Meeting, Technology Digest, 2001, pp. 19.4.1-19.4.4.
K. Goto et al, "High Performance 35 nm Gate CMOSFETs with Vertical Scaling and Total Stress Control for 65 nm Technology", Symposium on VLSI Technology Digest of Technical Papers, 2003, pp. 49-50.
S. Ito et al, "Mechanical Stress Effect of Etch-Stop Nitride and its Impact on Deep Submicron Transistor Design", International Electron Devices Meeting, Technology Digest, 2000, pp. 10.7.1-10.7.4.

* cited by examiner

*Primary Examiner*—Nathan W Ha
(74) *Attorney, Agent, or Firm*—Foley & Lardner LLP

(57) ABSTRACT

A semiconductor device comprises a semiconductor substrate, a plurality of transistors provided in the semiconductor substrate, and an isolation region for isolating the plurality of transistors to one another, the isolation region being comprised of an isolating insulation film, wherein a crystal structure of at least a part of the isolating insulation film is broken.

3 Claims, 3 Drawing Sheets

SEMICONDUCTOR DEVICE

CROSS-REFERENCE TO RELATED APPLICATIONS

The present application is a divisional of U.S. application Ser. No. 11/260,480, filed Oct. 28, 2005, the entire contents of which is incorporated herein by reference.

This application is based upon and claims the benefit of priority from prior Japanese Patent Application No. 2004-316419, filed Oct. 29, 2004, the entire contents of which are incorporated herein by reference.

BACKGROUND OF THE INVENTION

1. Field of the Invention

The present invention relates generally to a semiconductor device, and more particularly to a device isolation structure of a MOS transistor.

2. Description of the Related Art

As is well known, in a conventional device isolation structure, a shallow trench with a depth of about 0.5 µm or less is formed in a silicon substrate, and silicon oxide is filled in the trench, thereby effecting insulation between transistors. This technique is generally called STI (Shallow Trench Isolation).

In particular, the filled silicon oxide has a lower linear expansion coefficient than silicon, and thus causes a compressive stress in the surrounding silicon. The reason for this is that if silicon oxide, which is deposited at high temperatures, is cooled down to room temperature, the silicon oxide does not easily contract while the surrounding silicon contracts due to heat.

The compressive stress that occurs at end portions of the trench gradually attenuates as the distance from the end portions becomes greater. However, in a case where the distance between the end portion of the trench and the gate is small, the compressive stress does not greatly attenuate and it acts in a silicon region under the gate. The compressive stress, in particular, decreases the carrier mobility in an n-MOS transistor, leading to an adverse effect on the device, such as a decrease in ON-current.

Jpn. Pat. Appln. KOKAI Publication No. 2003-179157 and Jpn. Pat. Appln. KOKAI Publication No. 2003-273206 disclose such techniques that a tensile stress is additionally provided by interposing a silicon nitride film between silicon oxide, which is buried in a trench, and a silicon oxide film on the inner wall of the trench, or a compressive stress due to the buried silicon oxide is canceled by the tensile stress of the silicon nitride film.

BRIEF SUMMARY OF THE INVENTION

According to a first aspect of the present invention, there is provided a semiconductor device which comprises a semiconductor substrate, a plurality of transistors provided in the semiconductor substrate, and an isolation region for isolating the plurality of transistors to one another, the isolation region being comprised of an isolating insulation film, wherein a crystal structure of at least a part of the isolating insulation film is broken.

According to a second aspect of the present invention, there is provided a semiconductor device which comprises a semiconductor substrate, a plurality of transistors provided in the semiconductor substrate, the plurality of transistors comprising a first conductivity type transistors and a second conductivity type transistors, and an isolation region for isolating the plurality of transistors to one another, the isolation region being comprised of a first insulation film formed on an inner wall of a trench formed in the semiconductor substrate, and a second insulation film filled on the first insulation film, wherein a first distance between an end face of the first insulation film, provided at a side of each of the first conductivity type transistors in the isolation region adjacent to each of the first conductivity type transistors, and a semiconductor substrate surface, is different from a second distance between the end face of the first insulation film, provided at a side of each of the second conductivity type transistors in the isolation region adjacent to the each of the second conductivity type transistors, and the semiconductor substrate surface.

DETAILED DESCRIPTION OF THE EMBODIMENTS

Referring to FIG. 1 to FIG. 4, an isolation structure of a MOS transistor according to an embodiment is described along with a fabrication process. In the structure of this embodiment, a silicon nitride film (SiN) is provided within a trench, and ion implantation is not performed on the silicon nitride film in the trench of an n-MOS device, but ion implantation is performed only on the silicon nitride film in the trench of a p-MOS device.

In general, an n-MOS device and a p-MOS device have the following characteristics. If a compressive stress acts in the n-MOS device that <110> direction is a channel direction, the carrier mobility decreases regardless of the direction of current of the MOS device. In the p-MOS device that <110> direction is a channel direction, if the direction of current is parallel to the principal direction of stress, the carrier mobility increases due to compressive stress. Conversely, if the current direction is perpendicular to the stress direction, the carrier mobility decreases like the n-MOS device.

In the case where the STI structure is formed of a silicon oxide film, however, the compressive stress acts immediately under the gate. Consequently, aside from the p-MOS device, the electrical characteristics of the n-MOS device deteriorate. It is thus desirable to adopt an STI structure, which is not greatly affected by compressive stress, for the n-MOS device. Moreover, since p-MOS devices depend on the current direction of transistors and the principal stress direction, it is preferable to separately fabricate a structure in which a compressive stress acts greatly, and a structure in which a compressive stress does not act greatly.

Figure 1:
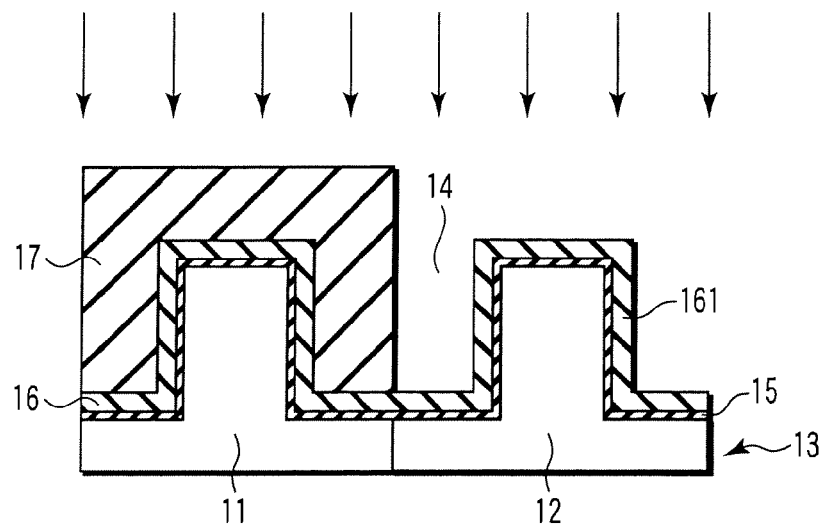
FIG. 1 is a cross-sectional view that schematically illustrates a part of a fabrication process of a semiconductor device according to an embodiment.

Specifically, as shown in FIG. 1, using an STI technique, a trench 14 with a depth of, e.g. about 0.5 μm or less is formed in a semiconductor substrate 13 that has a region 11 for an n-MOS device and a region 12 for a p-MOS device.

As in usual cases, a silicon oxide film 15 is formed on the exposed substrate surface including the trench 14, following which a silicon nitride film 16 is deposited. Then, covering the n-MOS device region 11 with a resist mask 17, germanium (Ge), for instance, is selectively ion-implanted vertically, or at a desired angle, in the silicon nitride film 16 that is formed on the p-MOS device region 12. Thus, an ion-implanted silicon nitride film 161 is formed. In the ion-implanted silicon nitride film 161, the crystal structure of the silicon nitride film 16 is broken and the stress is relaxed. In this case, it is important to select the dose as well as the acceleration energy and ion species such as Ge As and so on.

Figure 2:
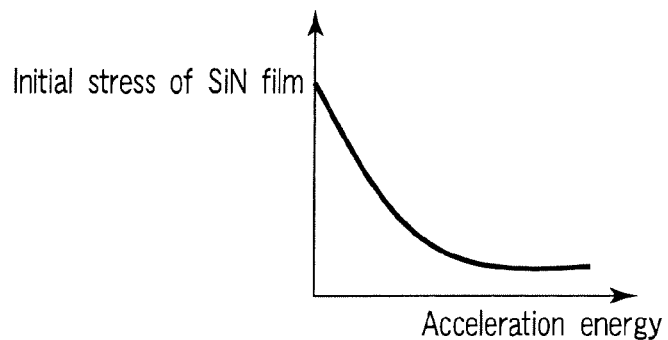
FIG. 2 is a graph showing a relationship between energy and an initial stress of a silicon nitride film.

FIG. 2 shows the relationship between the acceleration energy in ion implantation and the initial stress of the silicon nitride film. The acceleration energy and the initial stress have a correlation, and the stress can be controlled at a desired value by selecting a proper acceleration energy. In this case, it is important to select not only the acceleration energy, but also dose and ion species, such as Ge or As.

Figure 3:
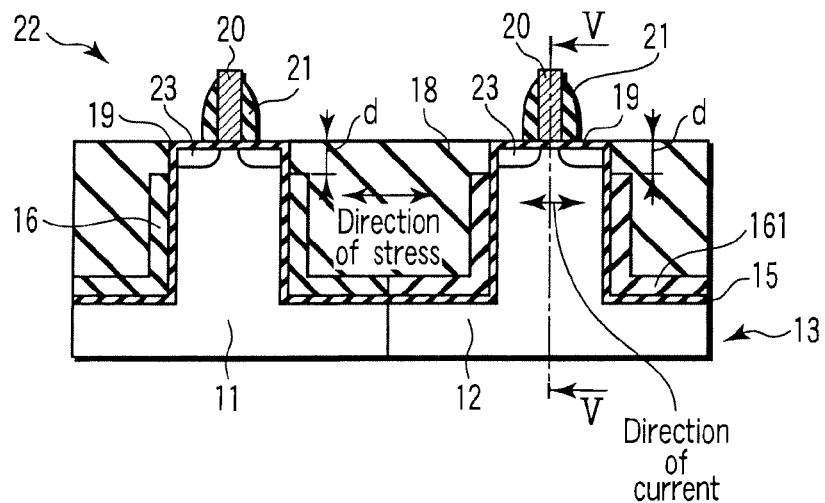
FIG. 3 is a cross-sectional view that schematically shows a part of the semiconductor device according to the embodiment.

As is shown in FIG. 3, after the resist mask 17 is removed from the substrate surface, a silicon oxide film ($SiO_2$) 18 is filled in the trench 14 and planarized, as in usual cases. Then, a gate structure 22 including a gate electrode 20 and a gate side wall 21 is formed on each of the separated active regions 11 and 12 via a gate insulation film 19. In addition, source/drain regions 12 are formed.

End faces of the silicon nitride films 16, 161 retreat from the substrate surface by a distance d, thereby adjusting the stress acting on the n-MOS and p-MOS device regions 11 and 12.

In the p-MOS device region 12 shown in FIG. 3, the direction of current flowing between the source and drain is parallel to the direction of stress, as indicated by arrows. Thus, in order to enhance the carrier mobility, it is preferable to apply the compressive stress in the direction of the channel. It is necessary, therefore, to relax, by ion implantation, the tensile stress in the p-MOS device region 12, which is caused by the silicon nitride film.

Figure 4:
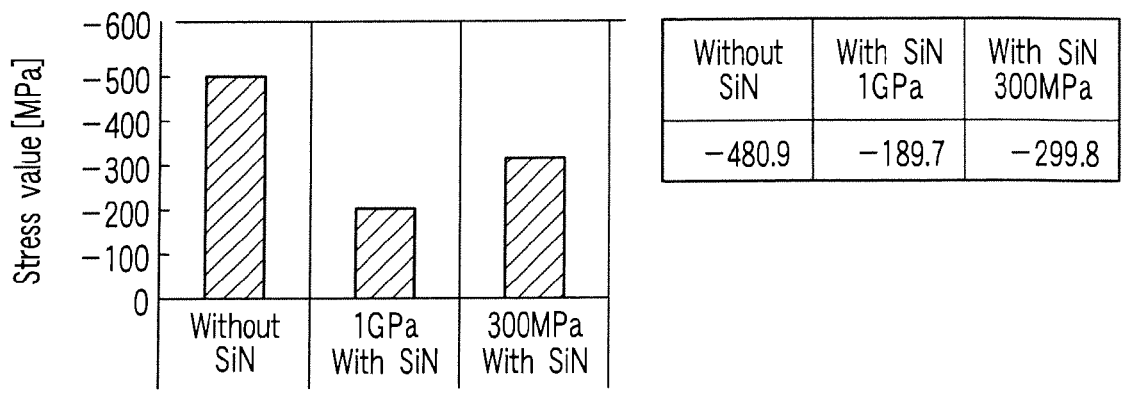
FIG. 4 shows a result of stress simulation.

FIG. 4 shows a result of stress simulation. In a conventional STI structure without a silicon nitride film, a transverse stress occurring immediately under the gate is a compressive stress of about 480 MPa. However, in the STI structure shown in FIG. 3 that includes the silicon nitride film with an initial stress that is the tensile stress of 1 GPa, the compressive stress is about 190 MPa, that is, the compressive stress greatly decreases by about 300 MPa. This is because of the great initial tensile stress of 1 GPa that is possessed by the silicon nitride film. A plus (+) sign is added to the tensile stress, while a minus (−) sign is added to the compressive stress.

By relaxing the compressive stress, a decrease in carrier mobility can be suppressed in n-MOS devices in which the current direction and stress direction are parallel or perpendicular, and in p-MOS devices in which the current direction is perpendicular to the stress direction.

As has been described above, the silicon nitride film 161 is subjected to the ion implantation. If it is assumed that the initial stress of the silicon nitride film 161 varies from a tensile stress of about 1 GPa to a tensile stress of 300 MPa, the compressive stress in the transverse direction just under the gate becomes about 300 MPa and the compressive stress that is to be applied can be made greater by about 100 MPa than in the case where no ion-implantation is executed. In this way, by making use of the difference in stress occurring in the n-MOS device and p-MOS device, the device with an adjusted carrier mobility can be obtained.

Figure 5:
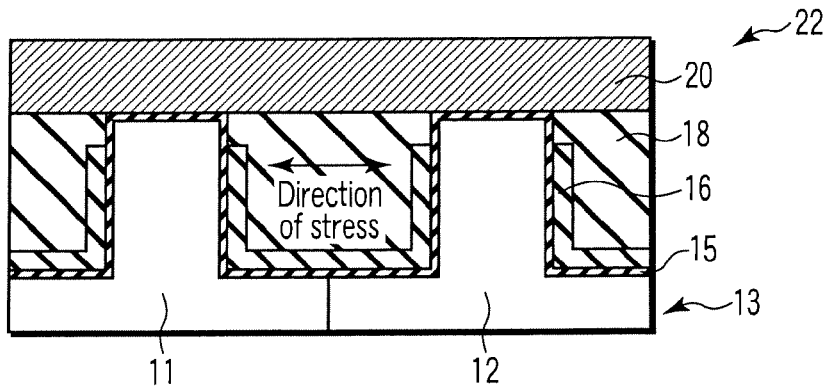
FIG. 5 schematically shows an example in which a principal stress direction is perpendicular to a direction of current, and is a cross-sectional view taken along line V-V in FIG. 3 that extends from a gate electrode along a semiconductor substrate.

FIG. 5 schematically shows an example in which the principal stress direction is perpendicular to the direction of current. FIG. 5 is a cross-sectional view taken along line V-V in FIG. 3 that extends from the gate electrode 20 along the semiconductor substrate 13. The structural elements common to those in FIG. 3 are denoted by like reference numerals. In this example, the current direction is perpendicular to the surface of the drawing sheet of FIG. 5. The gate structure 22, which includes the gate electrode 20, is formed on each of the separated active regions 11, 12 via the gate insulation film 19 so as to extend in a direction perpendicular to the direction of current.

Figure 6:
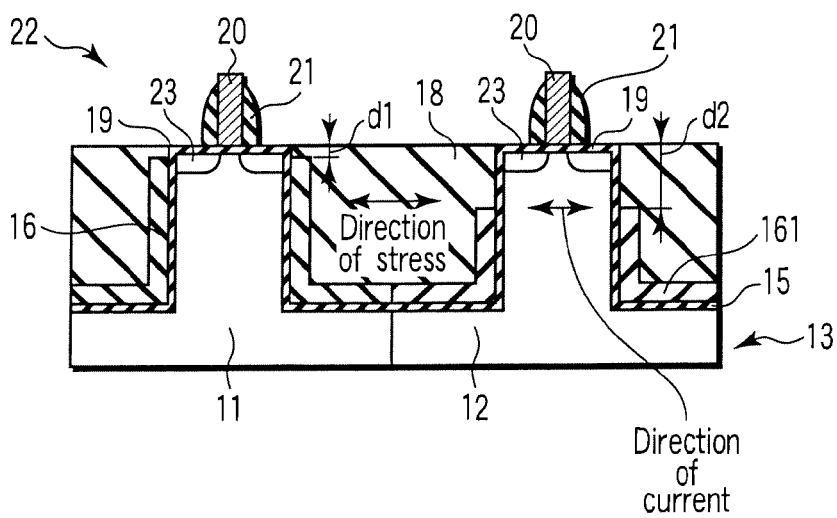
FIG. 6 a cross-sectional view that schematically shows a part of a semiconductor device according to an another embodiment.

FIG. 6 shows another embodiment for adjusting the stress acting on the channel of each of the n-MOS device and p-MOS device in the case where the silicon nitride film having a high tensile stress is used.

Using the STI technique similar to FIG. 1, the trench 14 is formed in the semiconductor substrate 13 that has the region 11 for the n-MOS device and the region 12 for the p-MOS device.

After the silicon oxide film 15 is formed on the exposed substrate surface including the trench 14, the silicon nitride film 16 is deposited. However, the embodiment is different from FIG. 3, the silicon nitride film 16 above the region 12 for the p-MOS device is not subjected to the ion implantation.

For the silicon nitride film 16 thus formed, the end face of the silicon nitride film 16 in the region 11 for the n-MOS device is retreated from the substrate surface by a distance d1, while the end face of the silicon nitride film 16 in the region 12 for the p-MOS device is retreated from the substrate surface by a distance d2(d1<d2).

Therefore, the tensile stress is applied to the n-MOS device, and the relaxed compressive stress is applied to the p-MOS device thereby improving the carrier mobility of each of n- and p-MOS devices.

When a film for applying the compressive stress to the channel is inversely used although the silicon nitride film 16 is used as one film for applying high tensile stress to the channel, the distance d1 in the n-MOS device is inversely made longer than the distance d2 in the p-MOS device. The stress value applied to the channel of each of n- and p-MOS devices can be then controlled.

As has been described above, the value of stress immediately under the gate can be controlled, not only by controlling the initial stress using ion implantation in the silicon nitride film, but also by adjusting the thickness of the silicon nitride film and the distance d between the silicon substrate surface and the upper end face of the silicon nitride film.

The film that is provided between the semiconductor substrate 13 and the silicon nitride film 16, 161 is not limited to the silicon oxide film 15, and it may be any film that can prevent peeling of the silicon nitride film. For example, a high-dielectric-constant insulating film is usable.

In the device design, 2-D or 3-D simulations may be used to find optimal shapes and dispositions, such as an optical trench shape, an optimal gate disposition and an optical SiN initial stress.

Figure 7:
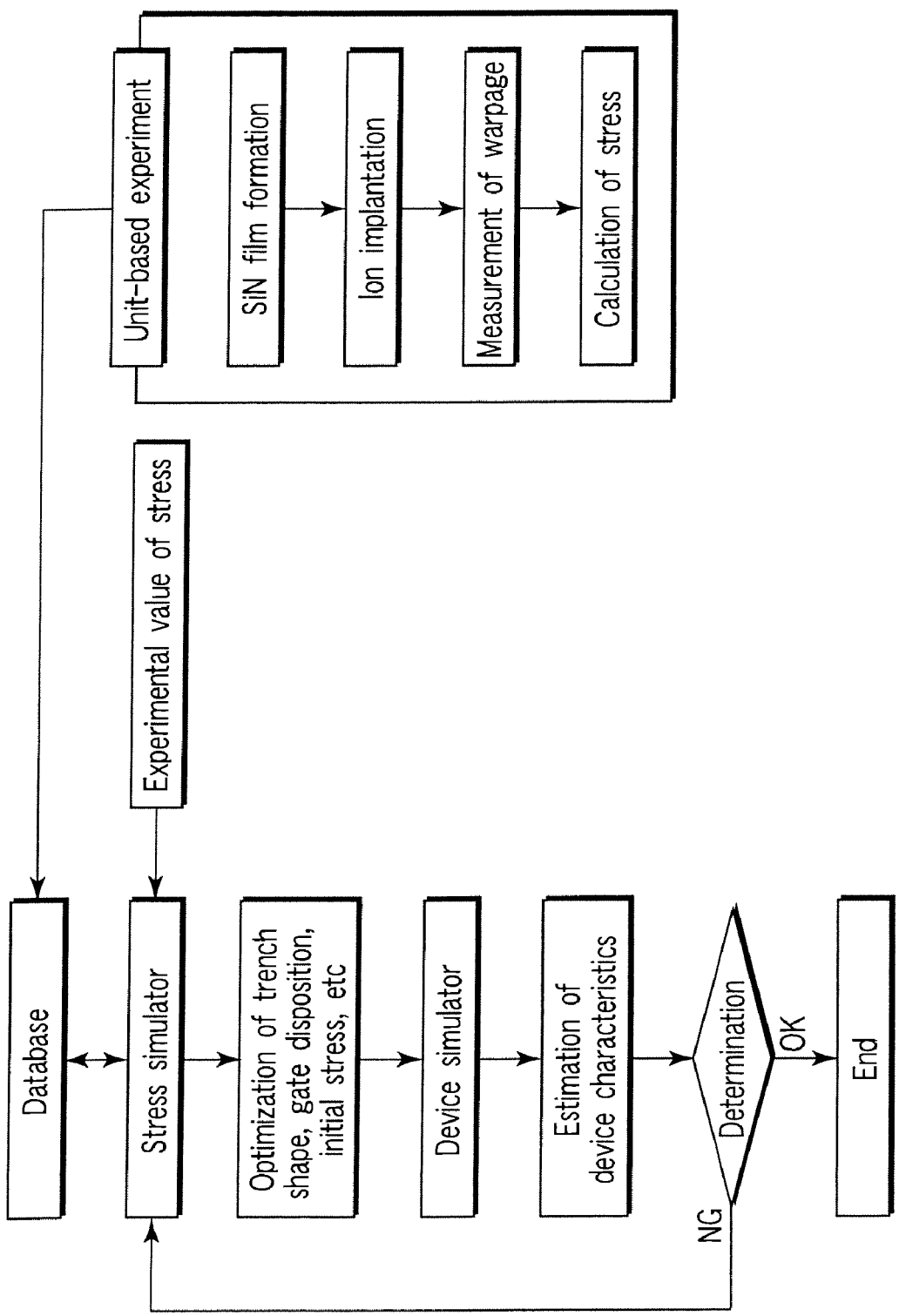
FIG. 7 is a flow chart according to the embodiment.

Specifically, the correlation between the initial stress of the silicon nitride film, the ion dose and the energy is found in advance by experiments using samples in which uniform silicon nitride films are disposed. Use is made of a method of calculating, as illustrated in FIG. 7, a stress to be caused, on the basis of a difference in amount of warpage before and after ion implantation. The obtained stresses, the dose of each ion species and the energy are stored in a database. The results are reflected on a stress simulator, and simulations are executed on a computer on the basis of actual measured values of the stresses, as to what shape of the trench is proper, and where the gate is to be disposed, and where ion implantation is to be carried out to relax the initial stress of the silicon nitride film.

Whether the simulation result successfully reproduces real stress values, etc. is determined by actually measuring the strain or stress value on the basis of diffraction images obtained using a Raman microscopy method or a transmission electron microscope with respect to a specific MOS device, and executing calibrations with simulation values. Thus, the precision in simulation can be maintained.

Then, stress values at respective locations are delivered to the device simulator having a model formula that represents the correlation between the stress and mobility, and the electrical characteristics, such as threshold voltage and ON-current, are estimated.

If the estimated electrical characteristics are not achieved, the loop beginning with the stress simulation is repeated. This optimization loop should preferably be automatically executed on the computer. In this case, the loop may be executed based on an experimental design method or various algorithms such as a genetic algorithm.

In the above-described embodiment, the silicon nitride film, which is formed by high-temperature CVD (Chemical Vapor Deposition), is assumed. The silicon nitride film formed by high-temperature CVD has a tensile stress, as described above. Thus, in the p-MOS device region where the carrier mobility decreases due to the tensile stress, the ion species is implanted to relax the tensile stress.

On the other hand, it is known that if a silicon nitride film is formed by plasma CVD, it has a compressive stress. Thus, in the case of using the silicon nitride film formed by plasma CVD, the p-MOS device region is masked and the ion species is implanted in the n-MOS device region to relax the compressive stress, thereby suppressing a decrease in carrier mobility in the n-MOS device region.

It is also known that a tensile stress can be imparted to the silicon nitride film, which is formed by plasma CVD, by adjusting the gas flow rate, pressure, etc. In short, a silicon nitride film, which has a small number of N—H bonds and a large number of Si—H bonds in accordance with predetermined process conditions of gas flow rate, pressure, etc., has a tensile stress. On the other hand, a silicon nitride film, which has a large number of N—H bonds and a small number of Si—H bonds, has a compressive stress.

Hence, in the case where the silicon nitride film with a small number of N—H bonds and a large number of Si—H bonds is deposited on the isolation region, the ion species may be ion-implanted in the p-MOS device region while the n-MOS device region is being masked. On the other hand, in the case where the silicon nitride film with a large number of N—H bonds and a small number of Si—H bonds is deposited on the isolation region, the ion species may be ion-implanted in the n-MOS device region while the p-MOS device region is being masked.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a plurality of transistors provided in the semiconductor substrate, the plurality of transistors comprising a first conductivity type transistors and a second conductivity type transistors; and
    an isolation region for isolating the plurality of transistors to one another, the isolation region being comprised of a first insulation film formed on an inner wall of a trench formed in the semiconductor substrate, and a second insulation film filled on the first insulation film,
    wherein a first distance between an end face of the first insulation film, provided at a side of each of the first conductivity type transistors in the isolation region adjacent to each of the first conductivity type transistors, and a semiconductor substrate surface, is different from a second distance between the end face of the first insulation film, provided at a side of each of the second conductivity type transistors in the isolation region adjacent to the each of the second conductivity type transistors, and the semiconductor substrate surface.

2. The semiconductor device according to claim 1, wherein the first distance is shorter than the second distance in the case where a tensile stress is applied to a channel of each of the plurality of transistors.

3. The semiconductor device according to claim 1, wherein the first distance is longer than the second distance in the case where a compressive stress is applied to a channel of each of the plurality of transistors.

* * * * *